United States Patent
Garcia

(10) Patent No.: US 6,541,069 B2
(45) Date of Patent: Apr. 1, 2003

(54) DRILL BIT FOR PRINTED CIRCUIT BOARD FABRICATION AND METHOD FOR TREATMENT THEREOF

(76) Inventor: Patricia McGrew Garcia, 10719 Valley Hills, Houston, TX (US) 77071

(*) Notice: Subject to any disclaimer, the term of this patent is extended or adjusted under 35 U.S.C. 154(b) by 0 days.

(21) Appl. No.: 09/901,370

(22) Filed: Jul. 9, 2001

(65) Prior Publication Data

US 2002/0046784 A1 Apr. 25, 2002

Related U.S. Application Data

(63) Continuation-in-part of application No. 09/476,854, filed on Jan. 3, 2000, now abandoned.

(51) Int. Cl.[7] .............................. B05D 1/36; B05D 3/02
(52) U.S. Cl. .................. 427/402; 427/376.1; 427/397.2
(58) Field of Search .......................... 427/397.2, 372.2, 427/376.1, 402, 443.2; 148/253

(56) References Cited

U.S. PATENT DOCUMENTS

| | | |
|---|---|---|
| 3,798,074 A | 3/1974 | Esler et al. |
| 4,153,483 A | 5/1979 | Holzl |
| 4,565,585 A | 1/1986 | Matsuda |
| 4,808,281 A | 2/1989 | Tison et al. |
| 5,073,196 A | 12/1991 | Fotinos et al. |
| 5,084,263 A | 1/1992 | McCoy et al. |
| 5,202,175 A | 4/1993 | Paz-Pujalt |
| 5,279,866 A | 1/1994 | Bourget et al. |
| 5,310,419 A | 5/1994 | McCoy et al. |
| 5,616,255 A | 4/1997 | Tumminaro, Jr. |

*Primary Examiner*—Michael Barr
(74) *Attorney, Agent, or Firm*—Browning Bushman, P.C.

(57) ABSTRACT

This disclosure sets out a method of forming a protective layer on the surface of the material of drill bits to increase the number of hits when drilling very small holes such as those drilled in printed circuit board (PCB's). The process involves forming a phosphorous based solution which is used as a dip to treat the drill bits, and then it is heated to drive off the solvent which is primarily water, oil, or glycol. This leaves a protective layer featuring phosphorous based materials on the surface of drill bit. This works for tool steel drill bits and also for those made with a cobalt alloy holding together tungsten carbide particles. The method preferably includes applying a treatment fluid in lieu of cutting oil during the fabrication of the cutting tool, the fluid including a compound containing phosphorus and nitrogen/hydrogen groups.

17 Claims, 7 Drawing Sheets

Spectrum file : MDCHEM

MOSI DRILL BIT          LIVETIME(spec.) = 100

| ENERGY | RES | AREA |
|---|---|---|
| -6.8 | 56.56 | 36281 |

TOTAL AREA = 52963

Peak at .00 keV omitted?      FIT INDEX = .

| ELMT | APP.CONC | ERROR (WT%) | |
|---|---|---|---|
| O K : 0 | 22.023 | 1.445 | |
| CoK : 0 | 6.487 | .636 | |
| W L : 0 | 58.148 | 2.936 | |
| SiK : 0 | 26.649 | .547 | |
| MoL : 0 | .450 | .450 | * Between 1 and 2 Sigma * |
| K K : 0 | 2.631 | .264 | |

ZAF CALCULATIONS      ....[ 4 iterations ]

20.00 kV TILT = 25.00 ELEV = .00 AZIM = 30.00 COSINE = 1.000

Spectrum : MOSI DRILL BIT      All elmts analysed, NORMALISED

| ELMT | ZAF Ratio | % ELMT | Error | | ATOM.% |
|---|---|---|---|---|---|
| O K : 0 | .464 | 28.356 +- | 1.860 | | 62.916 |
| CoK : 0 | .945 | 4.105 +- | .402 | | 2.473 |
| W L : 0 | .753 | 46.194+- | 2.332 | | 8.920 |
| SiK : 0 | .854 | 18.655+- | .383 | | 23.577 |
| MoL : 0 | .441 | .610+- | .610 | <2sd | .226 |
| K K : 0 | .756 | 2.081+- | .209 | | 1.889 |
| TOTAL | | 100.001 | | | 100.000 |

FIG. 5

Spectrum file : MDCHEM

SINGLE DIP     LIVETIME(spec.) = 100
ENERGY   RES    AREA
-6.7     56.09  36340
TOTAL AREA = 44766

Peak at .00 keV omitted?     Peak at 1.36 keV omitted? FIT INDEX = .

| ELMT | APP.CONC | ERROR (WT%) | |
|---|---|---|---|
| W L : 0 | 44.824 | 2.156 | |
| O K : 0 | 4.710 | .670 | |
| P K : 0 | -1.258 | .291 | ? Check profile |
| MoL : 0 | 1.250 | .301 | |
| K K : 0 | 2.271 | .181 | |
| CoK : 0 | 1.079 | .364 | * Between 2 and 3 Sigma * |

ZAF CALCULATIONS     ....[ 4 iterations ]

20.00 kV TILT = 25.00 ELEV = .00 AZIM = 30.00 COSINE = 1.000

Spectrum : SINGLE DIP    MDCHEM    All elmts analysed, NORMALISED

| ELMT | ZAF Ratio | % ELMT | Error | | ATOM.% |
|---|---|---|---|---|---|
| W L : 0 | .871 | 75.022 +- | 3.609 | | 27.923 |
| O K : 0 | .452 | 15.192 +- | 2.161 | | 64.971 |
| P K : 0 | .554 | -2.268+- | .525 | ? | -5.011 |
| MoL : 0 | .456 | 4.001+- | .963 | | 2.854 |
| K K : 0 | .767 | 4.319+- | .344 | <3sd | 7.559 |
| CoK : 0 | 1.072 | 1.468+- | .496 | | 1.704 |
| TOTAL | | 97.735 | | | 100.000 |

FIG. 7

Spectrum file : MDCHEM

DOUBLE DIP  LIVETIME(spec.) = 100
ENERGY   RES     AREA
-6.6     57.27   40490
TOTAL AREA = 314578

Peak at .00 keV omitted?   FIT INDEX = 78.83

| ELMT | APP.CONC | ERROR (WT%) |
|---|---|---|
| O K : 0 | 267.574 | 3.516 |
| AlK : 0 | 1.663 | .468 |
| W L : 0 | 17.764 | 2.299 |
| MoL : 0 | 41.957 | 1.392 |
| K K : 0 | 185.484 | 1.154 |
| F K : 0 | 191.356 | 1.437 |

ZAF CALCULATIONS   ....[ 6 iterations ]

20.00 kV TILT = 25.00 ELEV = .00 AZIM = 30.00 COSINE = 1.000

Spectrum : DOUBLE DIP  MDCHEM  All elmts analysed, NORMALISED

| ELMT | ZAF Ratio | % ELMT | Error | ATOM.% |
|---|---|---|---|---|
| O K : 0 | .393 | 58.532 +- | .769 | 77.770 |
| AlK : 0 | .664 | .215 +- | .061 | .170 |
| W L : 0 | .669 | 2.282+- | .295 | .264 |
| MoL : 0 | .675 | 5.347+- | .177 | 1.185 |
| K K : 0 | .922 | 17.293+- | .108 | 9.403 |
| P K : 0 | 1.008 | 16.329+- | .123 | 11.209 |
| TOTAL | | 100.000 | | 100.000 |

FIG. 9 ated be achieved# DRILL BIT FOR PRINTED CIRCUIT BOARD FABRICATION AND METHOD FOR TREATMENT THEREOF This is a Continuation-in-Part of U.S. patent application Ser. No. 09/476,854 filed Jan. 3, 2000, now abandoned.

BACKGROUND OF THE INVENTION

In the manufacture of a printed circuit board (PCB), it is necessary to drill holes in the PCB. When a PCB is made, it is rarely made in quantities of just one or two. Usually, it is made in large production runs of several hundred. When that occurs, it is important to drill all of them in the same fashion. Accordingly, the PCB will be first plated and then the etching will occur to locate the pads and leads on the PCB. This is true whether it is plated on one or both sides. Thereafter, holes are drilled through the PCB and the holes must be aligned with the leads and pads on previously formed on the PCB. This often requires that several of the PCB's be stacked together. Depending on thickness, it is possible to drill through at least two which are stacked, and it is often possible to drill through 10 or perhaps 20 depending on the length of the drill and the thickness of the stack. As the hole gets smaller, the number of stacked PCB's typically is reduced because the drill bit gets shorter.

It is difficult to make a very fine gauge drill bit of great length to drill through a large number of stacked PCB's.

The present disclosure is directed to a PCB drill bit which is particularly improved and which provides an improved drilling process. Accordingly, after drilling, the holes have highly defined circular edges with little fuzzing and sharp definition. Also, all of the holes in a stack will line up so that the stack is properly registered for the hole drilling process. To do this, the stack is held with some sort of registration device or edge. It is not uncommon to clamp perhaps 10 PCB's in a stack with edge located clamp mechanisms.

The PCB drilling routine of the present disclosure is markedly enhanced by the treatment applied to the drill bits. This is a very useful approach for drilling relatively small holes. The present disclosure is especially useful for drill bits which form holes of the size of 1.50 mm and much smaller down to 0.10 mm. With holes that small, it is very difficult to accomplish repeated accurate drilling. When the PCB's are assembled in a stack and are drilled by one bit passing through several of them, there is a production advantage obtained. The wear and tear on the drill bit is normally determined by the number of "hits", not the number of PCB's actually drilled. A hit is defined by the contact of the drill bit against a stack of PCB's. If, to pick an example, four, six, or eight of the PCB's are stacked then that number can be drilled with a single hit, meaning the drill bit contacts against the whole stack only once. That defines one hit, not the number of PCB's in the stack.

In the past, a typical drill bit of the gauge mentioned above would suffice for about 2,000 hits and then would require repainting. In effect, this is resharpening at the tip of the drill bit. When repointed, it would last another 2,000 hits. Regular usage of the drill bit of the size range noted above would typically yield about 8,000 hits. This would require three separate repointing steps for the last three increments of 2,000 hits each. The drill bit would then be thrown away even though there might be some modest life left in it.

Using 1999 prices, assume that the drill bit costs three dollars. The hand labor and the work to put a new point on it typically is about three dollars, and can be even more. Thus, to get 8,000 hits, the cost of the drill bit will be as much as $12, taking into account the three trips to a repointing shop or facility. In a large production situation, the repainting is typically done nearby by skilled craftsman who are trained for that purpose. This might reduce the price of that step somewhat, but it still will be an expensive undertaking. Furthermore, the repainting and reinstallation takes some amount of time which has been treated as negligible in the above calculation, but it still may well increase significantly the cost of $12 to make 8,000 hits.

Through the use of the present disclosure, as will be explained, a single drill bit can be increased from about 8,000 hits to about 12,000 hits. Even more profoundly, however, the three trips from the PCB drill press to the repair shop for repainting are avoided. Accordingly, even if the drill bit costs more initially, say four dollars, it is much cheaper in the long run because the number of hits is much higher and the labor reduced in repointing (which requires dismounting, removal, later mounting and repetition thereof). This whole sequence is much easier to execute because repair of an individual drill bit is substantially eliminated.

The present disclosure is therefore able to provide a 50% increase in production for a single drill bit in the above mentioned example (an increase from 8,000 to 12,000 hits). While that 50% increase in production is obtained, the cost of the drill bit over the life of its use is reduced from about $12 to less than half of that.

The present disclosure is directed to an improved drill bit construction with a surface treatment applied to it. The surface treatment involves the initial manufacture of the drill bit with the sharp point as appropriate for the type of bit and the size of the bit. Treatment of teh surface of the drill bit can be accomplished simply by using the treatment materials discussed herein in lieu of cutting oil during the manufacture of the drill bit. The heat produced during the matal cutting is sufficient to bond the treament material to the newly cut surface of the drill bit. However, this method requires the cooperation of the manufacturer. Alternatively, after fabrication, the bit is prepared for the present enhancement which involves heating to a modest level. Then, it is dipped into a solvent which has a phosphorous surface treatment chemical in it. The solvent can be water-based, glycol based, or oil based. This surface treatment is applied to the drill bit, and especially in the portions of the drill bit which make contact with the PCB while drilling, and the compound provides a surface conversion or surface treatment of the drill bit material. All of the surface of the cutting portion is treated to a relatively thin depth of the material, in a more or less uniform layer. It is highly desirable that the treatment be applied to a depth of about one to five angstroms (Å), and more particularly to a depth of about two Å. As will be understood, surface layers that thin are difficult to measure. In effect, measurement of such a thin layer is accomplished best by inference. Preferably, the layer is formed by the indicated liquid base, and heat is used to drive off any surplus solvent. For instance, the drill bit can be initially heated to about 150° F., dipped in the liquid base and then heated afterwards to something less than about 200° F. In general terms, it is not necessary to heat it any hotter than about 175° F. to 200° F. to dry the treatment.

The foregoing application is achieved rather easily. While easily done, and easily adherent to the drill bit, it is effectively cured and forms a relatively tough, but slick surface. This slick surface seems to increase the life by reducing the wear and tear on the surface as a result of abrasion. While obviously the drill bit is many orders of magnitude harder than the PCB, there is eventually some wear and tear on the drill bit. In fact, it is commonplace to make the drill bit of tungsten alloys including tungsten carbide. Sometimes, the tungsten metal is alloyed with other metals so the finished drill bit is very hard. By contrast, the PCB can be effectively defined as a woven fiber glass fabric which is impregnated with elastomeric materials. Even the plastic of the PCB will wear out the hard metal alloy of the drill bit after much use.

In that context, a thin protective layer of about one to about five Å provides a high level of enhanced protection. The protection assures that the drill bit does not wear out as rapidly in the example given above, provides about a 50% increase in life in operation and achieves that at a 50% or more reduction in cost, taking into account the cost of repainting during use.

The present disclosure contemplates the protection of drill bits of different types of material. It is not uncommon to make such drill bits of tool steel. These drill bits have a specified dimensional stability and a fairly well predicted life. In addition, however, to tool steel, some of these drill bits are made of tungsten carbide particles. The tungsten carbide (WC is the chemical symbol) are made of such particles held together in a supportive alloy matrix. The alloy is primarily formed of cobalt along with several other alloy metals. Typically, the supportive matrix will comprise somewhere between five and twenty percent of the material with the remainder being formed of the WC particles. In the alloy itself, somewhere between 80 and 95 percent of it is normally cobalt (Co). The cobalt based alloy is a binding matrix which holds the WC particles together and provides dimensional stability and structural integrity. Moreover, the WC particles tend to be somewhat brittle and run the risk of breaking, but that is modified in the drill bit construction because the cobalt alloy matrix provides a yieldable material, which, in the composite structure, is relatively immune to shock loading. Therefore, for long production runs, the WC particles in the cobalt alloy matrix is the more desirable and higher grade drill bit. There is, however, a problem with the use of cobalt based drill bits. Cobalt interacts in a negative way with certain materials. In particular, cobalt is sensitive to silicon based materials and/or the solvents. Preferably, they simply do not make contact with the alloy because that will otherwise destroy the alloy. In the present disclosure, the protective material to be described first forms a conversion surface. Thereafter, a second layer may be formed comprising soluble silicates. That enables protection to be applied to tungsten carbide based drill bits. Moreover, that permits the protection to be placed in a fashion which assures long durability and the requisite protection of the drill bits when faced with long production runs.

The present disclosure is therefore summarized as a method of protecting drill bits and especially small diameter drill bits which are typically in the range of about 1.5 mm and smaller in diameter. It is intended to be used with such drill bits to provide a protective layer on the surface that is measured in the range of one or two Å for the preferred version and up to about five Å. The treatment is applied by initially making the drill bit to the desired shape, then heating the drill bit and dipping it in a glycol base solution of phosphorous materials as defined below, and thereafter heating until the surface is dry. In testing subsequently with various test instruments, the surface shows a conversion surface containing phosphorous and appears to have a thickness in the range of about one or two angstroms. The finished drill bit then is ready for use. During use, it appears to run much cooler and holds a point and sharp edge longer. It is conjectured that the surface friction is reduced, thereby extending drill bit life.

BRIEF DESCRIPTION OF THE DRAWINGS

So that the manner in which the above recited features, advantages and objects of the present invention are attained can be understood in detail, more particular description of the invention, briefly summarized above, may be had by reference to the embodiments thereof which are illustrated in the appended drawings.

It is to be noted, however, that the appended drawings illustrate only typical embodiments of the invention and are therefore not to be considered limiting of its scope, for the invention may admit to other equally effective embodiments.

FIGS. 4 through 9 are actual test results of drill bits treated in accordance with this invention.

DETAILED DESCRIPTION OF THE PREFERRED EMBODIMENT

This disclosure is directed to a method of forming a protective layer on the surface material of drill bits and especially drill bits which are intended to drill very small holes, such as through a PCB. These will be described in general terms as a twist drill. A twist drill is shaped with a point and has cutting edges at the tip, and is constructed with chip clearing flites defining a chip clearing passage; there can be one or more along the length of the twist drill bit body. The present disclosure, however, markedly enhances the life and durability of a twist drill. Assume for purposes of discussion that the twist drill is made of tool steel or made of even harder materials including alloys of tungsten and may well include very hard particles of tungsten carbide and the like. While it can be a monolithic and uniform metal alloy, it can also be discontinuous with cast or bonded inserts in it. It is commonplace to mount very hard carbide particles at the cutting edge and support them in an alloy matrix of less hard materials, but which are still quite hard, i.e., tool steel. In that sense, the composite construction still comprises a single drill bit taking into account the tip of the drill bit, the long shaft and the upper end which fits in some suitable chuck. It is not necessary to finish the entire drill bit, but it is very helpful to finish the entire portion which actually does the cutting. In other words, the finish of the present disclosure is applied from the tip up to the maximum height of the flutes on the drill bit. The twist drill discussed in the present disclosure can be made of typical tool steel which are used for cutting tools. Alternatively, it can have appropriately located WC inserts. Or, it can be formed entirely of WC particles of a specific size range which are held together in the structure by a typical binding alloy, the most common being a cobalt based alloy. Distinctions regarding the metal in the drill bit will be discussed below.

Figure 1:
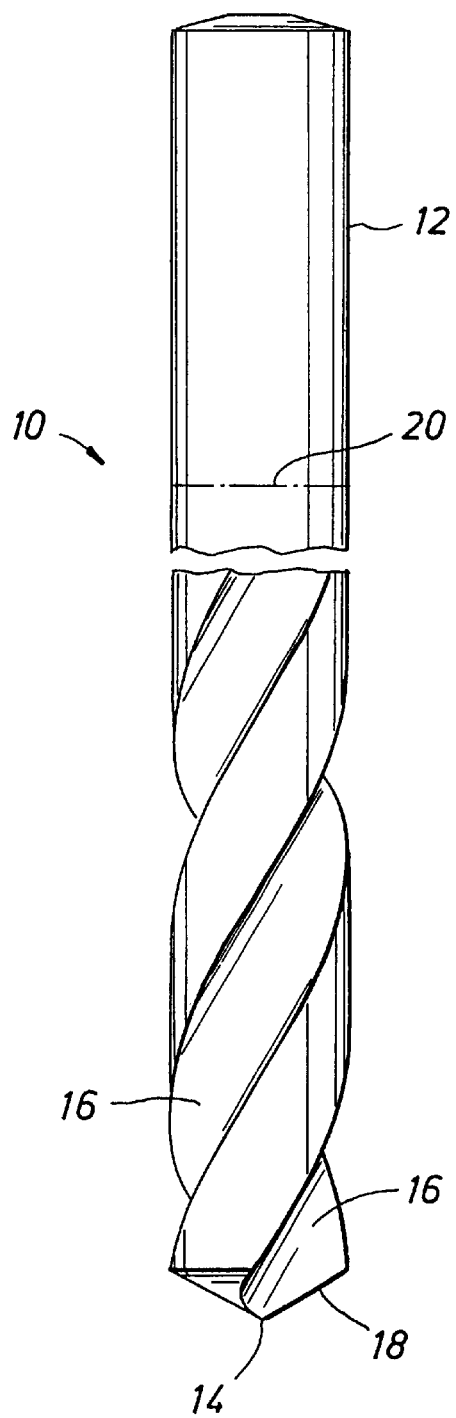
FIG. 1 is a side view of a drill useful in forming holes in a printed circuit board.

In FIG. 1 of the drawings, the numeral 10 identifies a drill bit of conventional construction. It has an upper cylindrical shank end 12. It has a pointed tip 14 at the opposite end. One or more chip clearing grooves 16 is formed. It turns to the left or to the right thereby defining a helix along the length of the drill bit. The cutting edge 18 defines a sharp edge which removes material when cutting. The chips made by the edge 18 fall into the groove 16 and travel along it. In effect, it is a chip clearing channel. It extends up the drill bit to a defined area at about 20, being an arbitrary line beyond which the grooves do not extend. Commonly, the grooves or flutes along the drill bit extend anywhere between about 50% and about 80% of the length of the drill bit. As the drill bit becomes quite small, the upper end of the drill bit above the arbitrary line 20 may be larger in diameter than the part that actually forms the hole. On the other hand, the drill bit may be uniform in diameter along its full length. In either instance, it has the grooved portion extending from the point 14 upwardly. That entire portion below the line 20 is preferably treated through the process described below.

The present disclosure is a method of forming a protective layer on the drill bit. To make the treatment material, a solvent is provided, and phosphorous based materials are dissolved in it. The solvent can be water-based, glycol-based, or oil-based. Applicant incorporates by reference the phosphorous based materials which are set forth in U.S. Pat. Nos. 5,084,263 and also 5,310,419. The specifics of those disclosures will be discussed below. The phosphorous based material in those two patents is dissolved in a base. The phosphorous based material is added in the base liquid to any ratio desired. Effectively, the base liquid serves as a solvent and the phosphorous based material is dissolved in the solvent. The ratio can be less than 1% phosphorus based material.

Figure 2:
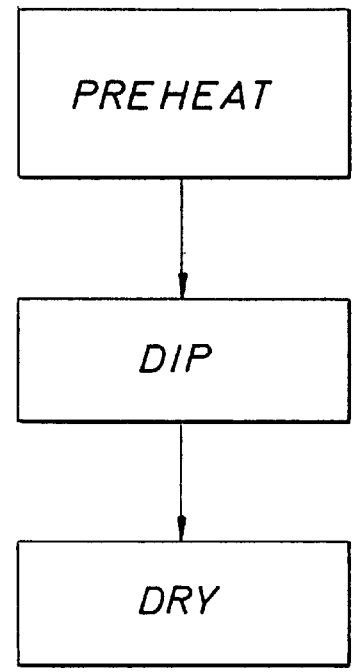
FIG. 2 is a simplified flow chart of processing steps to treat the drills of the present disclosure.

Attention is directed momentarily to FIG. 2 of the drawings. It shows in a simple flow chart the steps necessary to apply the treatment material of the present disclosure. In the primary method of treatment, the drill bit 10 is first heated. It can be heated in an oven, or in a hot air blast. It can also be heated directly in a flame. The bit needs to be raised from ambient to a moderate temperature somewhere in the range of about 150° F. to about 250° F. The next step involves dipping the heated drill bit 10 into the liquid solvent. The last step is heating to dry. It appears that heating to boil off excess liquid is desirable, perhaps involving a hot air blast at about 210° F. In that step, the liquid on the drill bit is driven off by heat. As will be explained, a new surface is then left on the drill bit, and as the solvent dries, the converted surface forms to a sufficient hardness and thickness that it provides protection as will be explained.

In the foregoing, the preheat and drying step both involve heat. The drying step is for the expressed purpose of driving off the excess liquid. The preliminary step of preheating is to enhance and speed up the bonding stage at which time the material to be discussed bonds somewhat to the exposed metal structure. Keeping in mind that the drill bit is exposed to substantial abrasive wear and tear, the bonding of the material to that surface assures that the treatment material will stay on the drill bit even during the abrasive use that is required for it.

The details of the treatment material should be considered carefully. In U.S. Pat. No. 5,084,263 and especially in column 7, beginning with solution number 1, that disclosure sets out the blending, with an exothermic reaction, the premixed mixtures one and two. Primarily, the premix number 1 is a very strong basic material which is derived from a mixture of ammonium hydroxide along with potassium hydroxide, thereby obtaining a mixture having a pH of about 14. By contrast, premix mixture number two is obtained from phosphoric acid in water which yields a pH of about 1 or even less. With such strong basic and acidic water solutions, a significant amount of heat is released. As stated in that patent, and assuming an ambient temperature of about 70° F., the heat released carries the mixture to about 180° F., a jump of about 110° F. By pouring the second premix into the first, the pH changes from about 14 and heads rapidly towards a neutral pH. As observed in column 7 of that patent, the pH approaches the neutral value, and when neutral, that indicates that the acid/base cancellation and neutralization is substantially complete and violence in the reaction then is calmed. The solution that results from that example comprises a compound containing water, phosphorus, nitrogen/hydrogen groups and potassium which are combined in a stable solution. Similarly, solution number two provides a compound containing water, phosphorus, nitrogen/hydrogen group, and sodium. Both of these compounds include phosphorous and nitrogen/hydrogen groups, and I have discovered that treating drill bits with compounds which include these two ingredients results in a surface conversion on the drill bits which includes a phosphorous treatment and nitriding and hydriding of the surface layer of the tool. Further, the resulting hard, tenacious surface treatment is applied without electroplating, as in the prior art.

Figure 3:
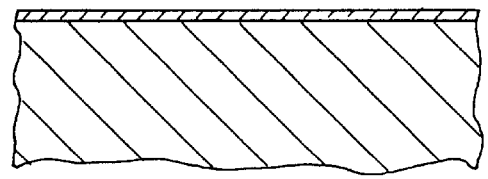
FIG. 3 is an enlarged sectional view through a portion of a drill bit showing a thin conversion surface on the drill bit.

Preferably, the material of example 1 in the '263 patent is made in a water solution and then may be added to a glycol solvent. The phosphorous based material fabricated by that process is described at column 15 of the '263 patent in an electroplating context. The present disclosure focuses primarily on the mode of application completely free of electroplating techniques. The precise nature of the phosphorous based material used in the treatment process is not fully known. However, to make a glycol-based solvent, it is suggested that the water dissolves readily in the glycol and solubility of the phosphorous based material is not significantly impacted by placing the material in the glycol base. It appears that the material of the present disclosure forms a protective layer which makes a sufficiently adherent bond to a thickness measurement in the range of about 1 to about 5 Å. It bonds adequately to the drill bit so that abrasive use as a drill bit does not quickly destroy the protective layer. It is a possibility that the heating at the surface during drilling in the PCB generates some heat and that particular heat flux serves as a post drying curing cycle. This theory suggests that any residual solvent even in trace quantities is driven off by the heat liberation at that time and therefore the heat liberation makes an even tougher but somewhat resilient bond. The theory goes on to state that the phosphorous based protective layer is dominated by the phosphorous molecule in the mixture even though some of the mixture may well have other salts (such as the salts of potassium) in the dried mixture. They do not seem to detract from the solid conversion surface. FIG. 3 shows a thin conversion surface which has been exaggerated for emphasis and which is literally in the range of just a few Å in thickness.

Treatment of Different Drill Bits

Assume that a drill bit formed of tool steel needs a protective layer. The materials set forth in the procedure above are placed on the drill bit to the thickness previously mentioned, typically being in the range of up to about 5 Å. Protective layers of this thickness are sufficient to enable a tool steel drill bit to last for a long time. The life of the tool steel drill bit is extended by the protective layer of the present disclosure. Especially, it is lengthened somewhat, and measurably so, in drilling the PCB's noted above.

The protective layer of the present disclosure can also be placed on a drill bit which is made with WC particles. This protective layer material works quite well on drill bits which are made with the cobalt based alloy. The protective layer of the present disclosure is especially effective for either type or class of drill bits.

Consider, now, another treatment material. A material known as Mosil 5000, according to the MSDS of the product, is comprised of soluble silicates along with molybdenum, phosphate, potassium, and acetic acid in a water solution. When dried, this proprietary product will provide a protective layer comprised of silicate salts. It especially finds use in band saw blades, drill bits, cutters in milling machines and the like. It is, however, undesirable when used with WC based cutting tools. The WC content is susceptible because the silicate in solution interacts with the cobalt in the alloy. It seems to weaken the alloy and make it either weaker or brittle, or both, and apparently has some kind of surface interaction. As a matter of conjecture, it is thought that the solvent which is essentially a strong base, reacts with cobalt and weakens the binding effect of the alloy. Accordingly, the present disclosure sets forth a two-protective layer process. The first protective layer is obtained from the above mentioned phosphorous based materials more fully developed in the '263 and '419 patents. This provides a first protective layer on the drill bit in the procedure set forth in FIG. 2. The procedure of FIG. 2, however, is repeated a second time. The first time that the procedure of FIG. 2 is executed, the above mentioned phosphorous based materials are applied. On the second time, the Mosil 5,000 material is applied in the same manner, the temperature is raised and it is dried. In effect, heat at perhaps 180° to about 210° drives off any water or other solvent in the silicate solution. Once the solvent or water is gone, a thin protective layer is again provided. The thin protective layer is conjectured to be in the range of about 1 to about 10 Å. This particular thin protective layer, however, is a silicate based protective layer which, while placed on a cobalt based alloy tool, nevertheless does not contact it. Rather, the silicate is in contact with the protective layer from the earlier dip and dry sequence. This comprises first and second surface layers which prevent the silicate and the solvent associated with it from attacking cobalt in the alloy.

By using the foregoing procedure, a double layer can be applied. This double layer seems to have greater life, but not just because of thicker layer(s). As will be understood, the thickness of the layer cannot be increased to thereby increase the life of the drill bit. If it is made extra thick, there is always the greater risk of fracture of the protective layer which is a thin crystalline layer of just a few molecules thickness. The dual layer system has an advantage in that regard.

Experimental data seems to indicate that the phosphorous based protective layer of the present disclosure extends a life of either tool steel or tungsten carbide based drill bits by a substantial percentage. When the silicate layer is added on top of the phosphorous layer, tool life is also again extended, and this is again more than what would be obtained with this single phosphorous based layer. In other words, the silicate layer adds life above and beyond the phosphorous base layer. With the single or double layers, it appears that the shelf life of the drill bits (both tool steel and WC) is essentially indefinite.

Choice of the particular solutions set forth in the '263 patent is exemplified beginning with solution no. 1 in column 7 of that patent. Solution no. 2 appears equally acceptable, and the solutions 1–20 appear to be acceptable. Solution 20 is somewhat different, in that it adjusts the pH with a mixture of two somewhat different acids. The two acids appear equally effective as a single acid. The teaching of the referenced '263 patent are further exemplified in the '419 patent, see for example the various solutions described beginning at column 7 of that disclosure.

Figure 4:
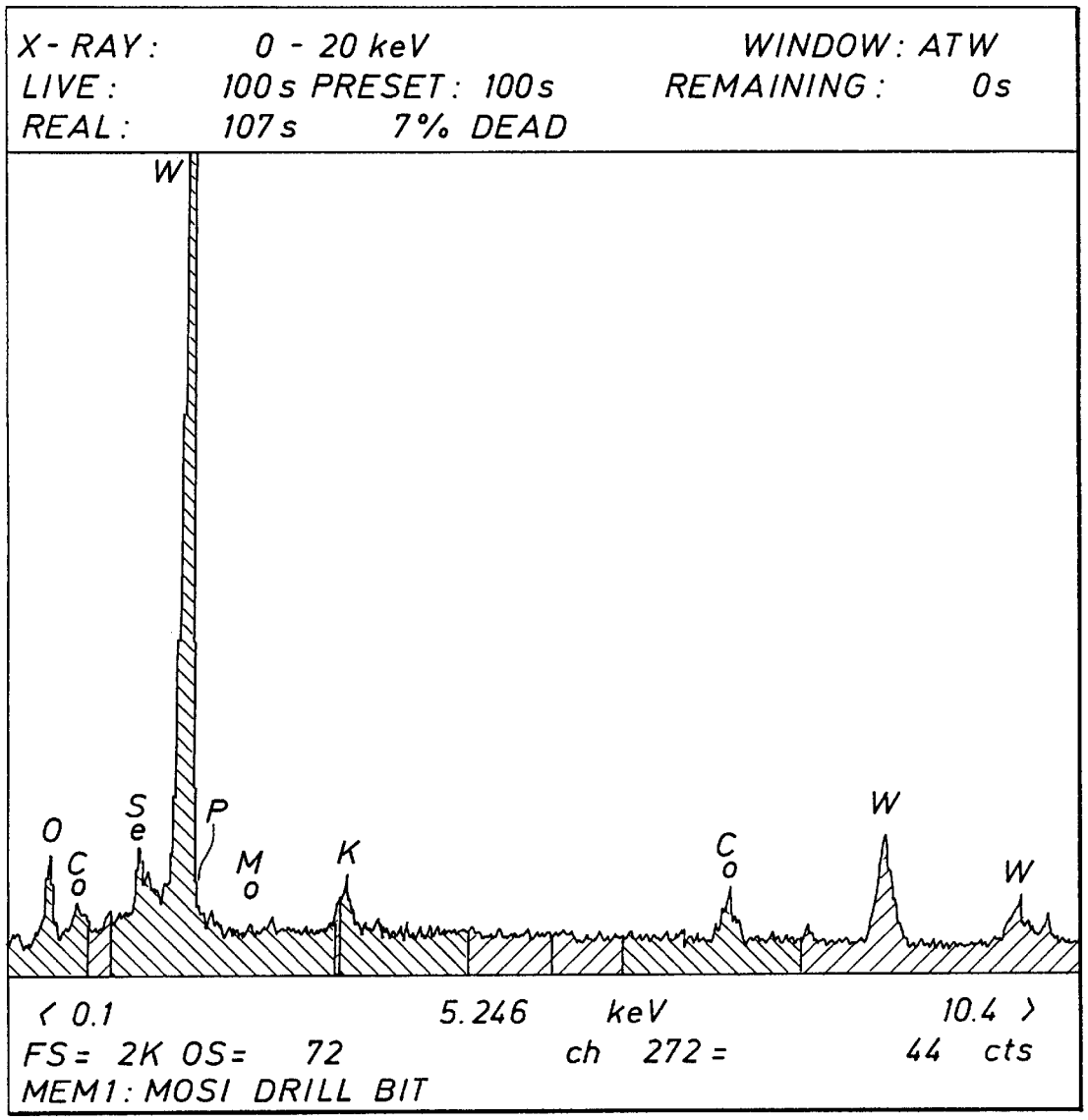
Figure 6:
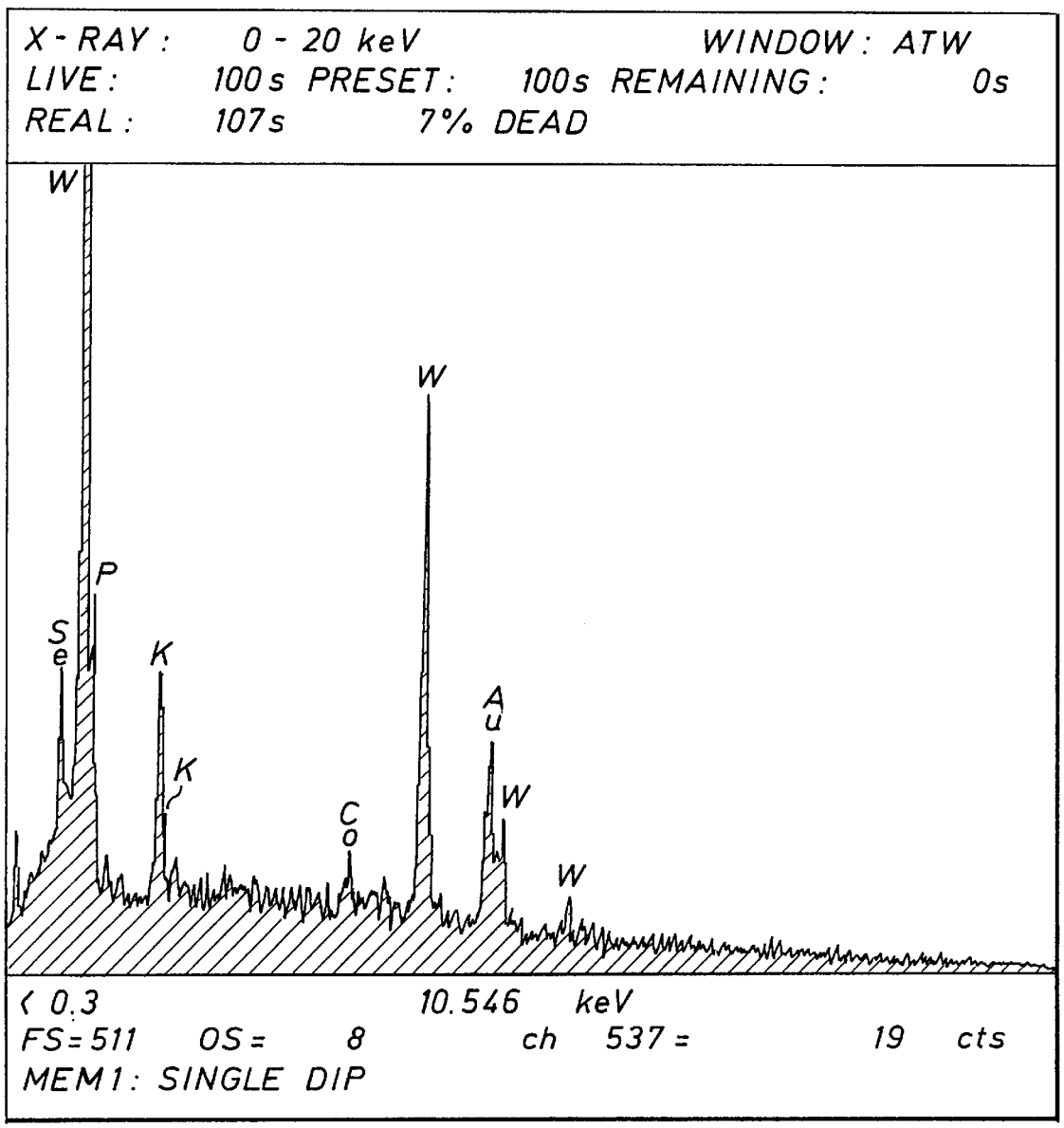
Figure 8:
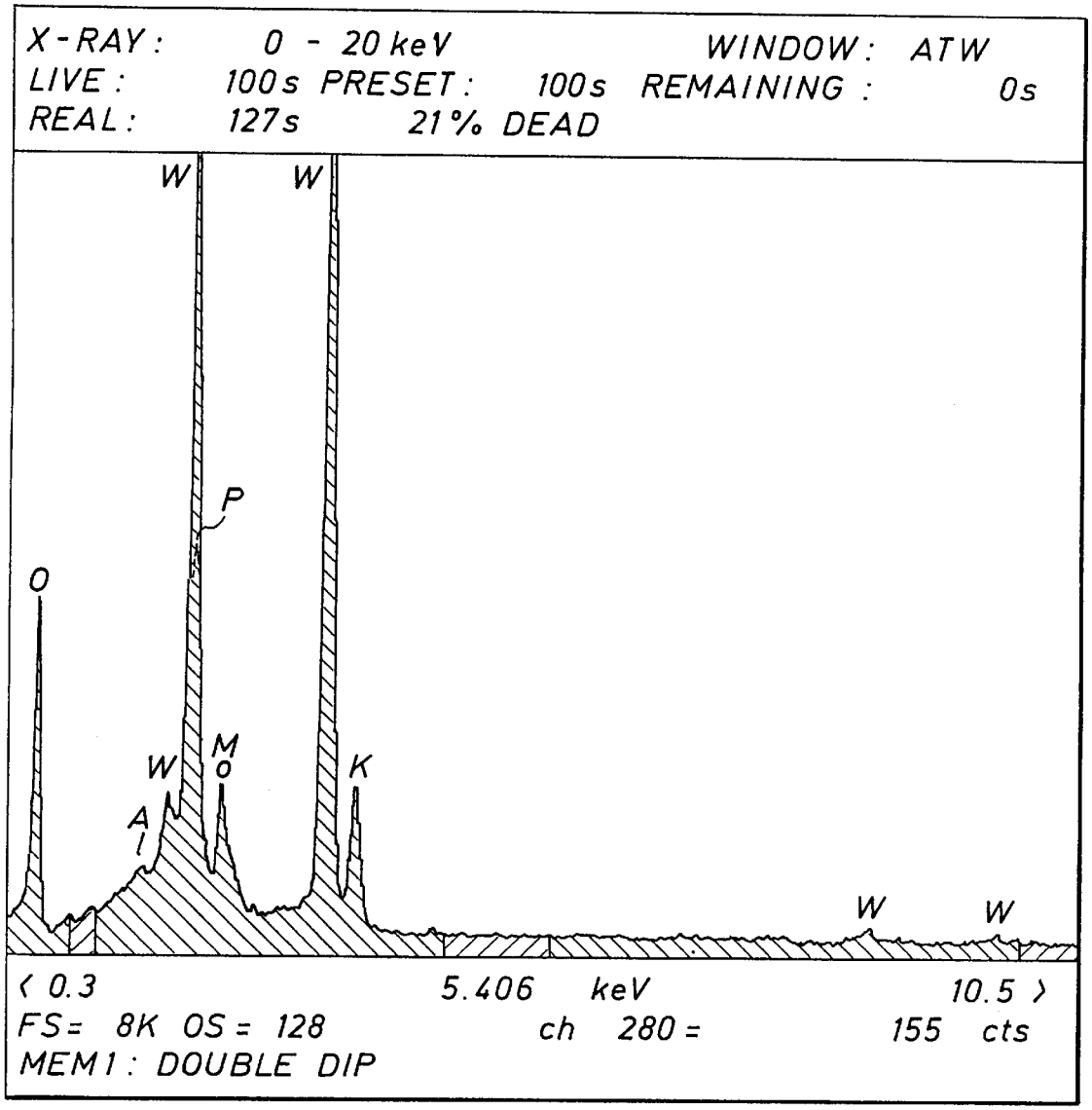

FIGS. 4 through 9 show test results of drill bits treated in accordance with this invention. FIGS. 4, 6, and 8 show electron microscope spectral results, and FIGS. 5, 7, and 9 illustrate numerical data. As shown in FIGS. 4 and 5, the preferred treatment for tools made of steel includes the use of Mosil, notable for its emphasis on molybdenum and silicon. FIGS. 6 and 7 show results of tests on tungsten carbide tools treated with a single application of a solution of phosphorus, nitrogen, potassium, and molybdenum. Note the indication of the presence of cobalt in FIGS. 6 and 7. FIGS. 8 and 9 show test results for similar tools, but with two such treatments; note the absence of cobalt in these test results. The indication of cobalt in FIG. 6 is from the metal of which the tool is made. Thus, the second treatment provides additional protection of the tool metal, since no cobalt is shown in the results of the double treatment.

While the foregoing is directed to the preferred embodiment, the scope thereof is determined by claims which follow.

I claim:

1. A method of forming a protective layer on a drill bit comprising the steps of applying a treatment fluid in lieu of cutting oil during the fabrication of a cutting tool, the fluid including a compound containing phosphorus and nitrogen/hydrogen groups, whereby a phosphorous based protective layer and a hydrided and nitrided layer are formed on the surface of the drill bit.

2. The method of claim 1 wherein the treatment fluid is dried by heating to a temperature sufficient to form the protective on the drill bit.

3. The method of claim 2 where the temperature for the drying step involves heating to about 200° F.

4. The method of claim 3 wherein the step of heating includes heating with a hot air blast.

5. The method of claim 1 wherein the protective layer includes materials left from the compound including water, phosphorous, potassium, and nitrogen/hydrogen groups, and wherein the nitrogen/hydrogen groups provide the hydrided and nitrided layer on the surface of the drill bit.

6. The method of claim 1 wherein the protective layer left after drying include a phosphorous based protective layer on the surface of the drill bit.

7. The method of claim 1 wherein the step of heating forms a protective layer which seals the drill bit surface.

8. The method of claim 1 including the post treatment step of placing a second protective layer on the first protective layer wherein the second protective layer is isolated from contact against the drill bit by the first protective layer.

9. The method of claim 1 wherein the method is applied to cutting tools made of tool steel.

10. The method of claim 1 wherein the step of applying a treatment fluid is repeated at least once to place a first protective layer on the drill bit and thereafter placing a second and different protective layer on the drill bit.

11. The method of claim 1 wherein the protective layer is the phosphorous based protective layer material and a silicate protective layer is placed on the phosphorous based protective layer.

12. The method of claim 1 wherein the phosphorous based protective layer defines a first new surface and further comprising the step of forming a second new surface on the first new surface, the second new surface comprising a phosphorous based protective layer.

13. The method of claim 1 wherein any treatment fluid remaining on the cutting tool is dried by heating to a temperature sufficient to form the protective layer on the cutting tool and the temperature for the drying step involves heating to about 200° F.

14. The method of claim 13 wherein the step of heating forms a protective layer which seals the drill bit surface.

15. The method of claim 14 including the post treatment step of placing a second protective layer on the first protective layer wherein the second protective layer is isolated from contact against the drill bit by the first protective layer.

16. The method of claim 15 wherein the protective layer is the phosphorous based protective layer material and a silicate protective layer is placed on the phosphorous based protective layer.

17. The method of claim 1 wherein the method is applied to cutting tools made of metal alloys having tungsten carbide particles supported in a cobalt based alloy.

* * * * *